United States Patent [19]
Yamanishi

[11] Patent Number: 5,522,035
[45] Date of Patent: May 28, 1996

[54] BUFFER MEMORY SELF-DIAGNOSIS METHOD FOR INFORMATION SIGNAL PROCESSING APPARATUS

[75] Inventor: Takashi Yamanishi, Kanagawa, Japan

[73] Assignee: Sony Corporation, Tokyo, Japan

[21] Appl. No.: 230,094

[22] Filed: Apr. 20, 1994

[30] Foreign Application Priority Data

Apr. 22, 1993 [JP] Japan .................................. 5-120759

[51] Int. Cl.$^6$ ..................................................... G06F 11/00
[52] U.S. Cl. ......................................................... 395/183.06
[58] Field of Search ................................ 371/21.2, 15.1, 371/22.5, 22.6, 21.1; 395/183.01, 183.03, 183.05, 183.06, 183.18

[56] References Cited

U.S. PATENT DOCUMENTS 5,109,521  4/1992  Culley ...................................... 395/800

Primary Examiner—Hoa T. Nguyen
Attorney, Agent, or Firm—Limbach & Limbach

[57] ABSTRACT

In an information processing device such as an optical disc device which is used as an external memory unit of a computer, the increasing of the initial access time can be effectively avoided nevertheless the capacity of the buffer memory is bulked up. Only the partial region of the buffer memory is self-diagnosed and then recording and reproducing of the data is started so as to self-diagnose the residual region in the back ground.

4 Claims, 6 Drawing Sheets

BUFFER MEMORY SELF-DIAGNOSIS METHOD FOR INFORMATION SIGNAL PROCESSING APPARATUS

BACKGROUND OF THE INVENTION

1. Field of the Invention

This invention relates to a buffer memory self-diagnosis method for an information signal processing apparatus, for example, an optical disc apparatus utilized as an external storage for a computer.

2. Description of the Related Art

Heretofore, an optical disc apparatus is used as an external storage, and is capable of recording mass data.

After the power has been turned on, the optical disc apparatus used as an external storage for a computer executes predetermined self-diagnostic program, so that the important data can be surely recorded and reproduced.

For example, if it is used a buffer memory utilized as a cache memory which is a fault therein, the data outputted from a host computer may be incorrectly recorded, and the correctly reproduced data may be incorrectly outputted.

Therefore, this kind of optical disc apparatus executes the self-diagnostic program to confirm that it is in good order in the buffer memory and the like, and thereafter the data is written and read.

Meanwhile, if the capacity of a buffer memory is bulked up to enlarge the region utilized as a cache memory, the mean access time of the optical disc apparatus can be shortened, whereby the facilities can be increased.

However, if the buffer memory is bulked up, much time for self-diagnosis is required, so that there occurs a problem that the time from the power on to the start of access, that is, the initial access time, will become longer.

Particularly, in some computers capable of connecting this kind of the optical disc apparatus, there may be one which decides any operation for the case where the optical apparatus is not connected thereto, if there is unable to access the optical disc apparatus during a predetermined time after the power on. Therefore the optical disc apparatus may be unutilized, if the initial access time becomes longer carelessly.

SUMMARY OF THE INVENTION

In view of the foregoing, an object of this invention is to provide an information signal processing apparatus which can effectively avoid increasing of the initial access time nevertheless the capacity of the buffer memory is bulked up.

The foregoing object and other objects of this invention have been achieved by the provision of an information signal processing apparatus, comprising a buffer memory 12 for storing temporarily the recording data to input and output it, wherein; the buffer memory 12 stores the driving information required to drive a recording medium 6; at the initial starting, only a partial region of the buffer memory 12 is self-diagnosed to store the driving information in the region self-diagnosed; the recording medium 6 is driven to record and reproduce the recording data based on the driving information stored in the buffer memory 12; the residual region of the buffer memory 12 is self-diagnosed sequentially utilizing the waiting time during recording and reproducing of the recording data; and the recording data is inputted and outputted via the region of the buffer memory 12 to which self-diagnosis has been completed.

Furthermore, in an information signal processing apparatus of this invention, if the faulty portion is found in the residual region of the buffer memory 12 when the self-diagnosis has been performed, the recording data is inputted and outputted via the self-diagnosed residual region excepting the faulty portion.

The nature, principle and utility of the invention will become more apparent from the following detailed description when read in conjunction with the accompanying drawings in which like parts are designated by like reference numerals or characters.

DESCRIPTION OF THE PREFERRED EMBODIMENTS

Figure 1:
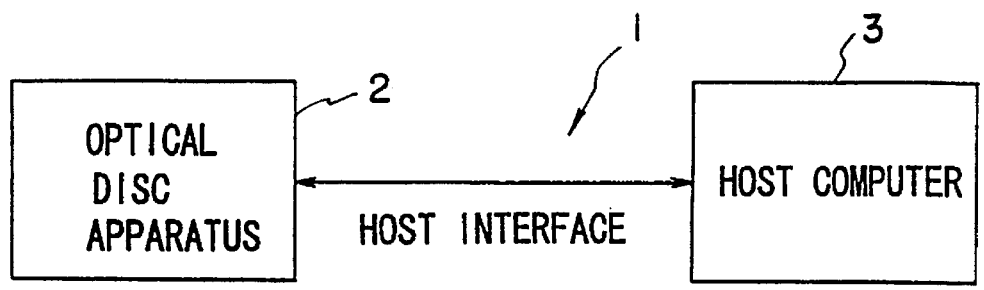
FIG. 1 is a block diagram showing a computer system according to an embodiment of this invention.

Preferred embodiments of this invention will be described with reference to the accompanying drawings:

In FIG. 1, 1 generally shows a computer system. An optical disc apparatus 2 is connected to a host computer 3 via a host interface.

Thereby, the computer system 1 can record various data, by utilizing the optical disc apparatus 2 as the external storage of the host computer 3.

Figure 2:
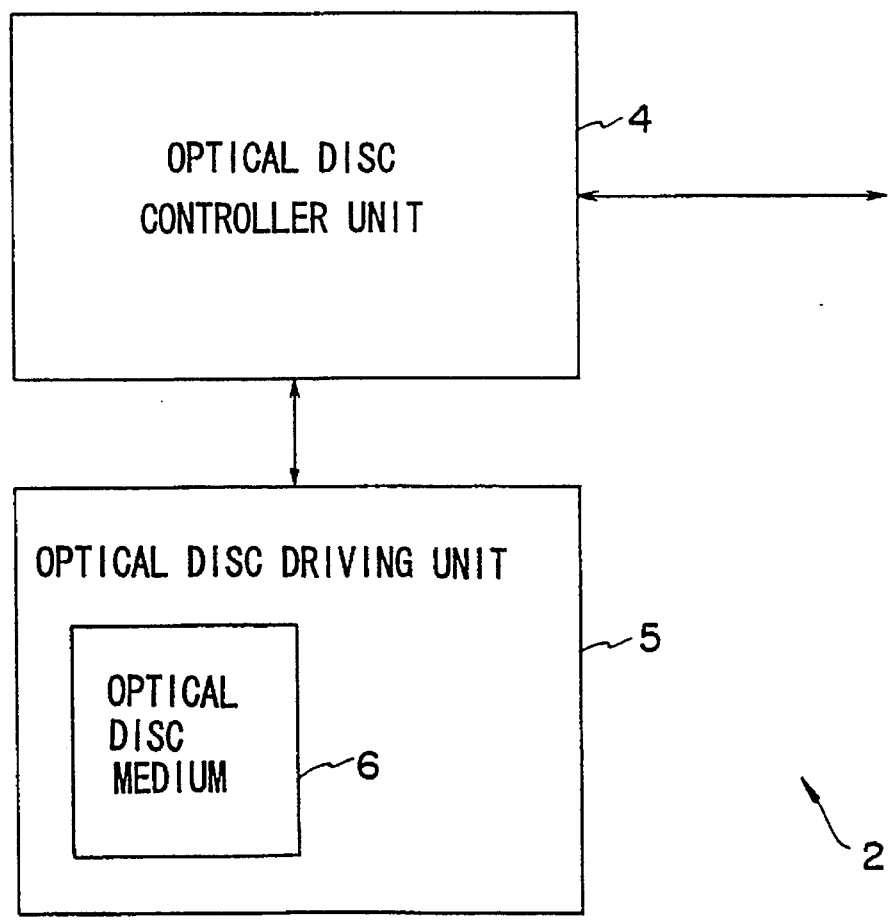
FIG. 2 is a block diagram showing an optical disc apparatus of this invention.

As shown in FIG. 2, the optical disc apparatus 2 inputs a control command outputted from the host computer 3 into an optical disc controller unit 4 via the host interface, and then controls an optical disc driving unit 5 by the optical disc controller unit 4. Thereby, the optical disc apparatus 2 can switch the whole operations corresponding to the control command, and output the various data outputted from the host computer 3 to the optical disc drive unit 5 to record on the optical disc medium 6, and further reproduce the data recorded on the optical disc medium 6 in order to output to the host computer 3.

Figure 3:
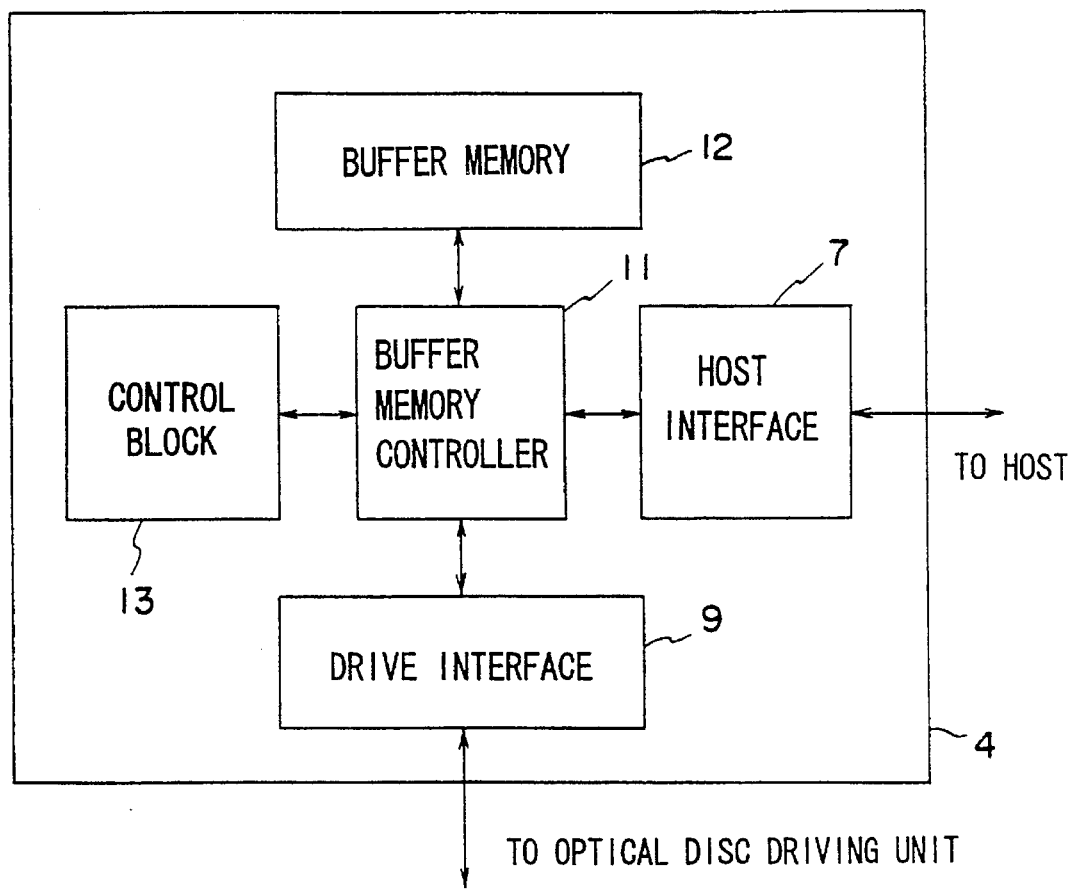
FIG. 3 is a block diagram showing an optical disc controller of this invention.

In the optical disc controller unit 4, as shown in FIG. 3, a host interface 7 inputs and outputs the control commands and the recording and reproducing data from and to the host computer 3. The drive interface 9 inputs and outputs the control codes and the recording and reproducing data from and to the optical disc drive unit 5.

With controlling the buffer memory 12, a buffer memory control circuit 11 can store the various driving information outputted from the optical disc drive unit 5 via the drive interface 9, which is required for driving the optical disc medium 6, into the buffer memory 12, and further utilizes the buffer memory 12 as the cache memory to input and output the recording and reproducing data from and to the host computer 3.

A large amount of memory such as 256 [kbyte] is totally utilized to the buffer memory 12. The drive information is stored in the partial region of this 256 [kbyte], and simultaneously the residual region is adopted to be utilized as the cache memory.

On the contrary, in a control block 13 composed of a central processing unit (CPU), a read only memory (ROM), a random access memory (RAM) etc., the CPU of the control block 13 executes the procedure of the program stored in the ROM corresponding to the control command and the like inputted through the host interface 7. Thereby, the CPU controls the whole operation of the optical disc apparatus 2, and furthermore issues the respondent command to the host computer 3, if necessary.

In these procedures, the CPU executes the self-diagnosis program stored in the predetermined region of the ROM when the power turns on and is reset, and thereby decides whether or not the data can be correctly recorded and reproduced.

Figure 4:
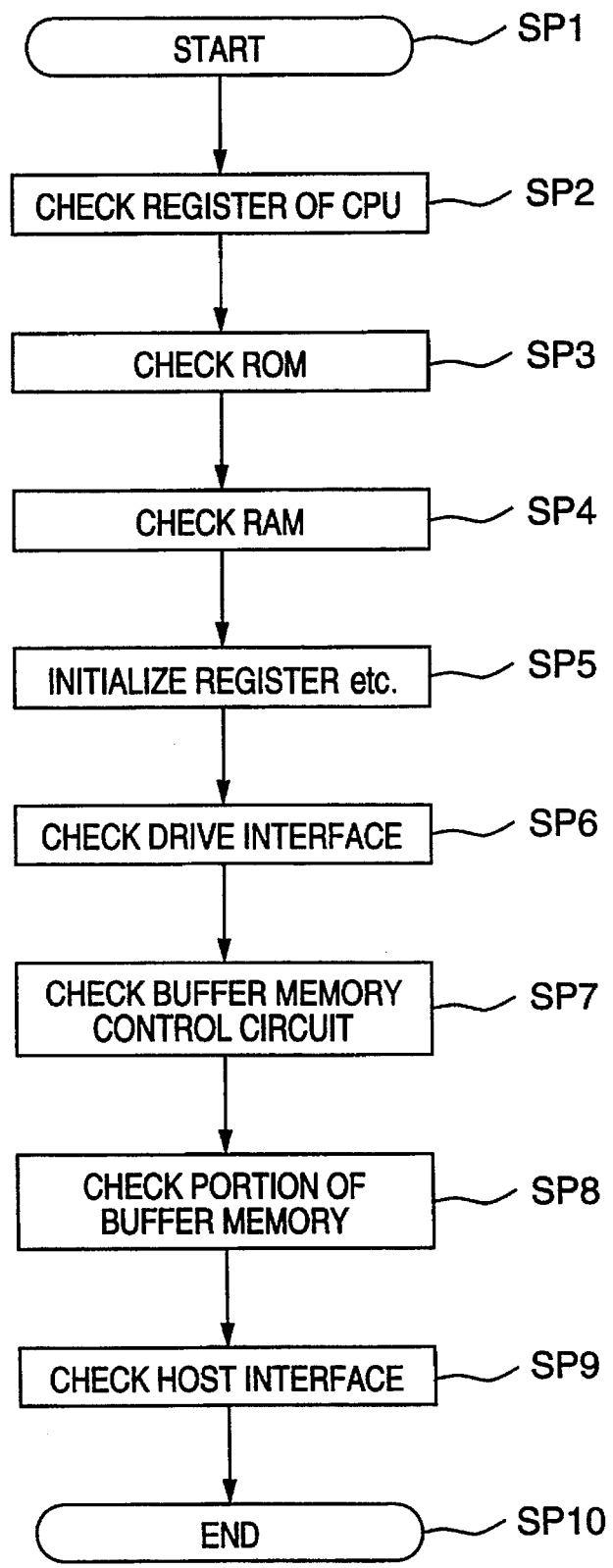
FIG. 4 is a flow chart explaining an operation of this invention.

That is, as shown in FIG. 4, the CPU proceeds from step SP1 to step SP2 on starting this self-diagnosis program. At step SP2, check data previously set is once written in the register provided in the CPU, and then is read out to check whether or not any abnormality exists in this register. The check data is memorized in the self-diagnosis program.

At the subsequent step SP3, the sum check of the ROM is performed so as to detect whether or not there is any abnormality. Subsequently at step SP4, the CPU once writes check data previously set in the RAM, and then reads out to detect whether or not any abnormality exists in the RAM.

Subsequently at step SP5, the CPU initializes the register and the interrupt vector built in the CPU, and at the subsequent step SP6, detects whether or not any abnormality exists in the drive interface 9. This detection of the abnormality of the drive interface 9 is executed by writing the check data once in the built-in register of the drive interface 9 and then reading it out. After the check of the drive interface 9 has been completed, the CPU executes the check of the buffer memory control circuit 11 at the subsequent step SP7.

This check of the buffer memory control circuit 11 is executed by writing in the check data into the built-in register and then reading it out, similar to the case of the drive interface 9. After the check of the buffer memory control circuit 11 has been completed, the CPU proceeds to step SP8 to check the buffer memory 12.

This region of 64 [kbyte] has the capacity in which the driving information required for the spin-up operation of the optical disc drive unit 5 can be stored. This driving information is once written in the buffer memory 12, and then read out to be memorized in the RAM of the control unit 13. Furthermore, hereupon self-diagnosis is performed only for the region having the capacity required to store the driving information. However, the minimum region required for buffering the recording or reproducing data may be allocated, in addition to the region required to store the driving information.

In the optical disc apparatus of this embodiment, it takes 2 minutes more or less to self-diagnose the 64 [kbyte] region in the buffer memory 12. On the contrary, if whole region of the buffer memory 12, that is 256 [kbyte] region, is self-diagnosed as ever, it takes 8 minutes more or less, so that the initial access time is shortened about 5 or 6 minutes. Besides, it takes about 0.5 minutes to self-diagnose the region except for the buffer memory 12, thereby it was required about 8.5 minutes for the initial access time heretofore. However, it takes only about 2.5 minutes with utilizing this embodiment.

After the self-diagnosis of the partial region of the buffer memory 12 has been completed, the CPU proceeds to step SP9 and once writes the predetermined check data in the register of the host interface 7, and then reads it out to detect whether or not there is any abnormality in the host interface 7, and proceeds to step SP10 to terminate the procedure.

Thereby, the CPU detects whether or not there is any abnormality in each part of the optical disc controller unit 4. If any abnormality is detected at this self-diagnosis processing, the CPU generates a warning via the host computer etc., if necessary.

Figure 5:
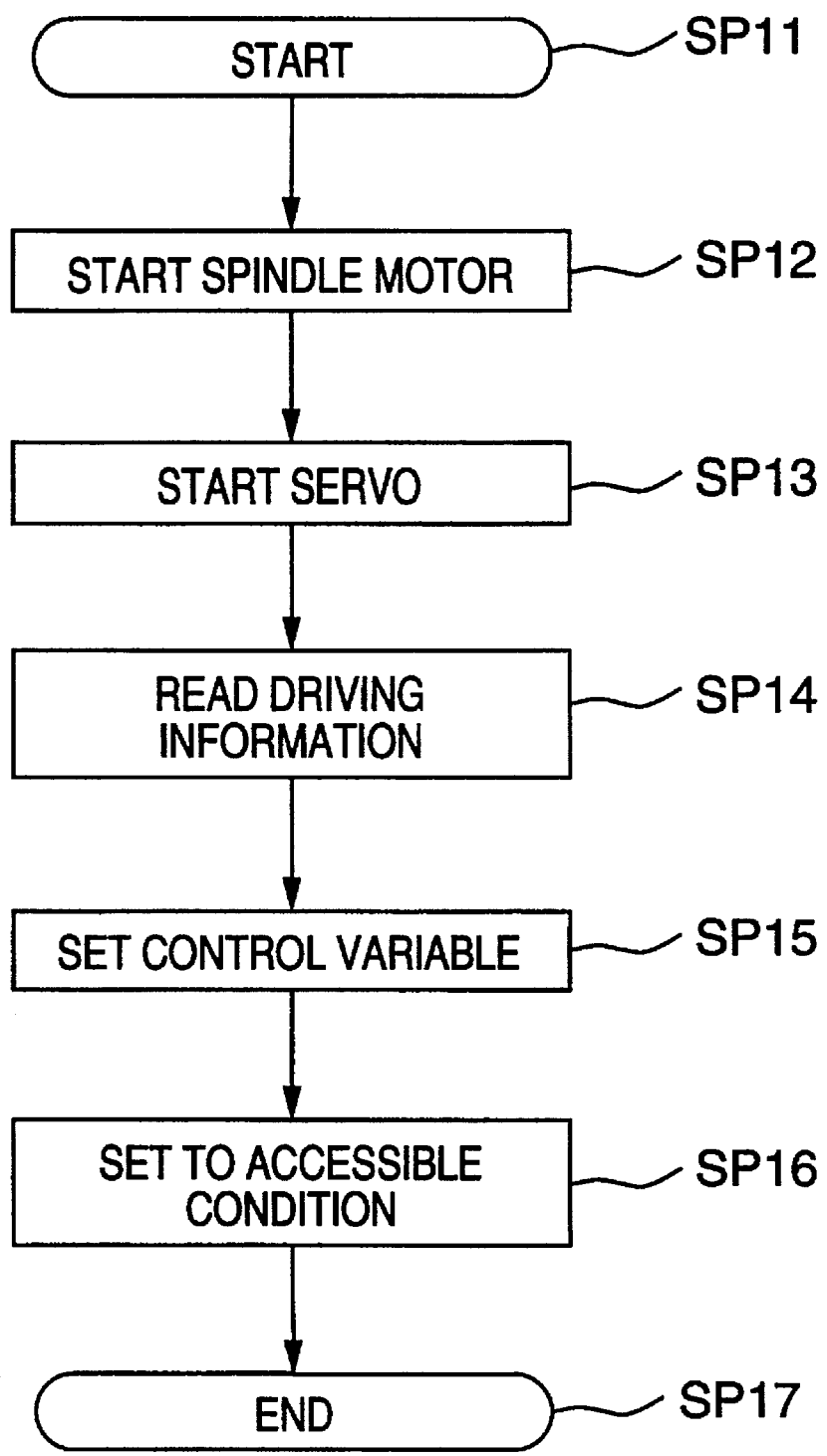
FIG. 5 is a flow chart explaining a spin-up operation of this invention.

On the other hand, in the case where any abnormality has not been detected, the CPU executes the spin-up process as shown in FIG. 5.

That is, the CPU proceeds from step SP11 to step SP12, and drives the spindle motor so as to rotate the optical disc medium 6 at the predetermined speed. Subsequently, the CPU proceeds to step SP13, and transfers the optical pick-up information to the innermost track of the optical disc medium 6 and raise to the operating state, to start the focus servo, the tracking servo, etc.

At the subsequent step SP14, the CPU reads the driving information recorded on the innermost track of the optical disc medium 6. This driving information is composed of the read power, the size of media, the logical format, the data representative of the kinds of the media such as reproduction-only or the like, the address data of the optical disc medium, the address data of the defect region, etc.. In the optical disc apparatus of this embodiment, the optical disc medium 6 is accessed based on this driving information.

After that, the CPU proceeds to step SP15 to select the control variable, such as the read power, required to drive the optical disc driving unit 5 based on the reproduced driving information, and then stores this selected control variable in the self-diagnosed region of the buffer memory 12. Thereby, the optical disc apparatus 2 is settled in the condition to be able to drive the optical disc driving unit 5. At the subsequent step SP16, the CPU outputs the control code showing that the spin-up operation has been completed to the host computer 3, and proceeds to the subsequent step SP17 to terminate the procedure.

Therefore, in the optical disc apparatus 2 of this invention, the initial access time can be shortened by performing the self-diagnosis to the minimum region required for the data access, thereafter performing the spin-up operation to them. Therefore, it can be more convenient to use the computer system 1 generally.

Furthermore, after the spin-up operation has been completed, the CPU self-diagnoses the residual region of the buffer memory 12, in utilizing the idle time when the host computer 3 is not accessing to the optical disc apparatus, and adds the region to which self-diagnosis is completed sequentially to the region to which self-diagnosis has been completed, to record and reproduce the desired data. In this way, the optical disc apparatus 2 self-diagnoses the residual region of the buffer memory 12 with the back ground process which is after the spin-up operation has been completed.

Whereby, since the optical disc apparatus 2 self-diagnoses in utilizing the idle time effectively when the optical disc medium 6 is not accessed, nevertheless self-diagnosis is performed on a partial region of the buffer memory 12 at the initial accessing, the whole region of the buffer memory 12 can be eventually used to record and reproduce the data.

In the self-diagnosis with the back ground process, the CPU terminates the self-diagnosis of the residual region if any faulty portion is detected in the buffer memory 12.

Figure 6:
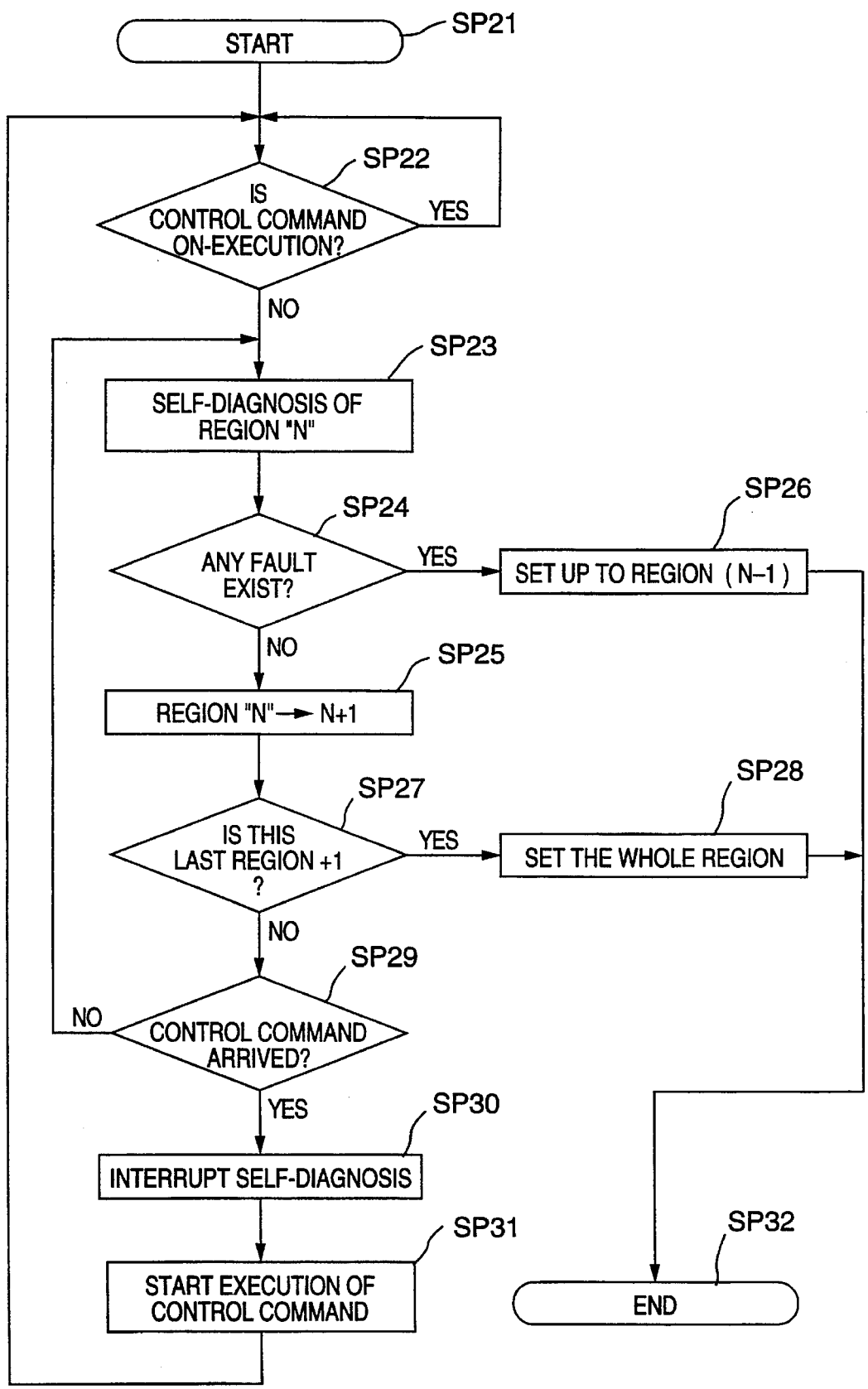
FIG. 6 is a flow chart explaining a self-diagnosis operation in the first embodiment of this invention.

This operation will be explained with reference to the flowchart shown in FIG. 6.

At first, the CPU proceeds from step SP21 to step SP22 to decide whether or not the control command is on-execution. When the control command is on-execution, the CPU repeats step SP22; and then the control command becomes off-execution, the CPU proceeds to the following step SP23.

At the step SP23, self-diagnosis is executed on the predetermined region "N" in the buffer memory 12. Then, at the next step SP24, the CPU decides whether or not any fault exist in the region self-diagnosed. Then, if there is a fault, the CPU proceeds to step SP26 to set up to the previous region "N−1" as the utilizing region, and proceeds to step SP32 to terminate the procedure.

On the other hand, in the case where any fault does not exist, the CPU proceeds to step SP25 to set the region "N+1" as the new region "N". After that, at the step SP27, the CPU decides whether or not the region "N" set at the present has the value of the last region +1. Then, if the present region "N" has the value of the last region +1, it means that self-diagnosis to the whole region is terminated and there is no fault in the whole region, so that the CPU sets the whole region as the utilizing region at the step SP28, and proceeds to step SP32 to terminate the procedure.

On the contrary, in the case where the present region "N" does not have the value of the last region +1 at the step SP27, it means that self-diagnosis about the whole region is not completed, so that the CPU proceeds to step SP29. At the step SP29, the CPU decides whether or not new control command has come. When the control command has not been arrived, the CPU returns to step SP23 to self-diagnose corresponding to the following region. When the control command has come, the CPU proceeds to step SP30 to interrupt the self-diagnosis, and then proceeds to step SP31 to start the execution of the newly-coming control command, and thereafter returns to step SP22.

In this manner, in the conventional information processing apparatus, there is a problem that the optical disc apparatus 2 cannot be used at all if there is even no more than one faulty portion though the almost all region of 256 [kbyte] is able to be utilized. On the contrary, according to this invention, if the residual region is self-diagnosed in the back ground and the self-diagnosis of the following region is interrupted when any faulty portion is detected, the data can be recorded and reproduced in utilizing the region which is before the faulty portion is detected. Therefore, the problem that the optical disc apparatus 2 can not be used at all because of only one fault can be effectively avoided, therefore, the whole system can be more facilitated.

According to this invention, at starting, only a partial region of the buffer memory is self-diagnosed to execute the spin-up operation and the residual region is self-diagnosed in the back ground, so that the time required for self-diagnosis at starting can be shortened, and hence the initial access time can be shortened.

In the embodiment described above, in the case where any fault is detected at the self-diagnosis in the background, the self-diagnosis is interrupted and the data is recorded and reproduced in utilizing the region to which any abnormality has not been detected. However, this invention is not only limited to this, but also the self-diagnosis may be kept on performing to record and reproduce the data in utilizing "the residual region" excepting the faulty portion.

Figure 7:
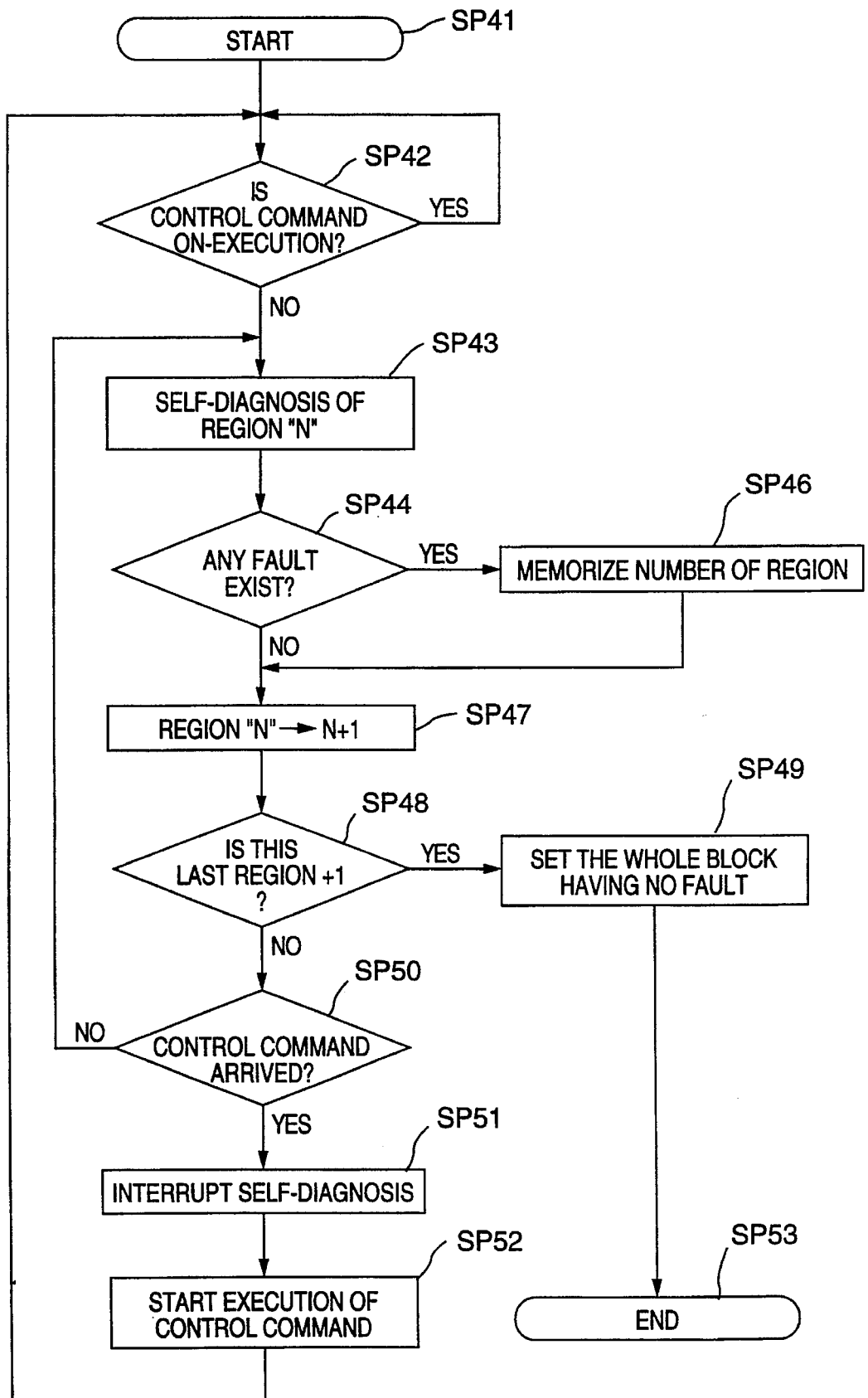
FIG. 7 is a flow chart explaining a self-diagnosis operation in the second embodiment of this invention.

This operation will be explained with reference to the flowchart shown in FIG. 7.

At first, the CPU proceeds from step SP41 to step SP42 to decide whether or not the control command is on-execution. When the control command is on-execution, the CPU repeats the step SP42; and then the control command becomes off-execution, the CPU proceeds to the following step SP43.

At the step SP43, self-diagnosis is executed on the predetermined region "N" in the buffer memory 12. Then, the CPU decides whether or not any fault exists in the region self-diagnosed at the step SP44. If there is a fault, the CPU proceeds to step SP46 memorizing the number of this region, and proceeds to step SP47. On the other hand, in the case where there is not any fault, the CPU proceeds to step SP47 to set the region "N+1" as the new region "N". After that, at the step SP48, the CPU decides whether or not the region "N" set at the present has the value of the last region +1. If the present region "N" has the value of the last region +1, it means that self-diagnosis to the whole region is completed and there is no fault in the whole region, so that the CPU sets the whole region as the utilizing region at the step SP49, and proceeds to step SP53 to terminate the procedure.

On the contrary, in the case where the region "N" set at the present does not have the value of the last region +1 at the step SP48, it means that self-diagnosis to the whole region is not completed, so that the CPU proceeds to step SP50. At the step SP50, the CPU decides whether or not new control command has come. When the control command has not been arrived, the CPU returns to step SP43 to self-diagnose corresponding to the following region. When the control command has arrived, the CPU proceeds to step SP51 to interrupt the self-diagnosis. Then, the CPU proceeds to step SP52 to start the execution of the newly-coming control command, and then returns to step SP42.

In the embodiment described above, the region of 64 [kbyte] out of the buffer memory of 256 [kbyte] is self-diagnosed at the beginning. However, this invention is not only limited to this, but also both the capacity of the buffer memory and the capacity of the region to be self-diagnosed at first can be selected freely.

Furthermore, in the embodiment described above, the buffer memory built in the optical disc device is self-diagnosed. However, this invention is not only limited to this, but also can be widely applied to, for instance, the case of self-diagnosis of the external RAM board. In this case, more RAM board can be installed in the optical disc device during the operation to detect the faulty portion of the RAM board.

Furthermore, in the embodiment described above, this invention is applied to the optical disc apparatus. However, this invention is not only limited to this, but also can be widely applied to a data streamer which is utilizing a magnetic disc apparatus, a magnetic tape, and the like.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A method for self-diagnosing of a buffer memory performed by an information signal processing apparatus having said buffer memory and recording or reproducing an information signal to or from a predetermined recording medium through said buffer memory, comprising the steps of:

a) self-diagnosing only a partial region of said buffer memory;

b) setting said partial region as a utilizing region in the case where no fault exists in said partial region;

c) reading out a driving information from said recording medium, said driving information being required for driving said recording medium;

d) memorizing the driving information read out at said step "c" in the region self-diagnosed at said step "a";

e) reproducing recording data from said recording medium based on said driving information;

f) self-diagnosing subsequently region of said buffer memory which is not self-diagnosed yet during a waiting time in which said step "e" is not being performed; and g) setting the region of said buffer memory self-diagnosed at said step "f" to be part of said utilizing region additionally in the case where no fault exists in the region self-diagnosed at said step "f".

2. The self-diagnosis method according to claim 1, further comprising the additional step of:

h) interrupting the operation of said step "f" when there is any fault in the region self-diagnosed at said step "f".

3. The self-diagnosis method according to claim 1, further comprising the additional step of:

i) memorizing which portion of said region has any fault, when a fault exists in the region self-diagnosed at said step "f".

4. The self-diagnosis method according to claim 1, wherein:

said recording medium is an optical disc; and said driving information is composed of the address information and the defect information of said optical disc.

* * * * *